United States Patent
Schuster et al.

(10) Patent No.: US 9,279,846 B2
(45) Date of Patent: Mar. 8, 2016

(54) FAULT IDENTIFICATION AND LOCATION IN A POWER SUPPLY LINE WHICH IS FED FROM ONE SIDE

(75) Inventors: Norbert Schuster, Leer (DE); Markus Spangler, Eckental (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 226 days.

(21) Appl. No.: 14/234,076

(22) PCT Filed: Jul. 21, 2011

(86) PCT No.: PCT/EP2011/062524
§ 371 (c)(1),
(2), (4) Date: Jan. 21, 2014

(87) PCT Pub. No.: WO2013/010591
PCT Pub. Date: Jan. 24, 2013

(65) Prior Publication Data
US 2014/0159740 A1 Jun. 12, 2014

(51) Int. Cl.
*H02H 7/00* (2006.01)
*H02H 3/00* (2006.01)
(Continued)

(52) U.S. Cl.
CPC ............ *G01R 31/08* (2013.01); *H02H 7/261* (2013.01); *H02H 7/266* (2013.01); *H02H 1/0061* (2013.01); *H02H 3/063* (2013.01)

(58) Field of Classification Search
CPC ....... G01R 31/08; H02H 7/261; H02H 7/266; H02H 3/063; H02H 1/0061
USPC ...................... 324/522; 361/64, 71
See application file for complete search history.

(56) References Cited

U.S. PATENT DOCUMENTS 3,970,898 A * 7/1976 Baumann .............. H02H 7/262
361/68
4,322,768 A 3/1982 Maeda et al.
(Continued)

FOREIGN PATENT DOCUMENTS

DE 102007020955 B4 10/2010
EP 0554553 B1 7/1996
(Continued)

OTHER PUBLICATIONS

Koch, G., et al., "Ein numerisches Stromvergleichsschutz mit digitaler Messwertübertragung über Lichtwellenleiter"/ "Numerical current comparison protection with digital measured value transmission via optical waveguide", Elektrie, Jan. 1, 1991, vol. 45, No. 7, pp. 272-276 VEB Verlag Technik, Berlin; with English language translation.
(Continued)

*Primary Examiner* — Jermele M Hollington
*Assistant Examiner* — Farhana Hoque
(74) *Attorney, Agent, or Firm* — Laurence Greenberg; Werner Stemer; Ralph Locher

(57) ABSTRACT

A power supply line is divided into a plurality of sections by switching devices each having an associated measurement device that detects a current signal at a measurement point at the respective switching device. The current signal is sampled to form current sample values, and a current measurement variable is determined. Each measurement device forms a delta current value (difference between an instantaneous current and a prior measurement), compares the delta current value with a current threshold value and identifies a jump in current when the delta current value overshoots the threshold. The measurement device, upon identifying a current jump, sends a status message indicating the jump. A fault location device identifies a fault on that section of the power supply line delimited by a switching device that has identified a jump and one that has not identified a jump in current.

22 Claims, 2 Drawing Sheets

(51) Int. Cl.
  *G01R 31/08* (2006.01)
  *H02H 7/26* (2006.01)
  *H02H 1/00* (2006.01)
  *H02H 3/06* (2006.01)

(56) References Cited

U.S. PATENT DOCUMENTS

| | | |
|---|---|---|
| 5,341,268 A | 8/1994 | Ishiguro et al. |
| 5,757,651 A | 5/1998 | Rudat |
| 6,381,109 B1 | 4/2002 | Burtin et al. |
| 6,469,629 B1 | 10/2002 | Campbell et al. |
| 6,907,321 B2 | 6/2005 | Kearny et al. |
| 7,110,231 B1 | 9/2006 | De La Ree et al. |
| 2007/0025036 A1 | 2/2007 | Morris et al. |

FOREIGN PATENT DOCUMENTS

| | | |
|---|---|---|
| EP | 1443624 A1 | 8/2004 |
| GB | 2072974 A | 10/1981 |
| RU | 2241295 C2 | 11/2004 |
| SU | 1436179 A | 11/1988 |
| WO | 9406189 A1 | 3/1994 |
| WO | 0048281 A2 | 8/2000 |
| WO | 2007132551 A1 | 11/2007 |

OTHER PUBLICATIONS

Englert, H., et al., "IEC 61850 Substation to control center communication—Status and practical experiences from projects.", 2009 IEEE Bucharest Powertech, Jun. 1, 2009, pp. 1-6.

\* cited by examiner

FAULT IDENTIFICATION AND LOCATION IN A POWER SUPPLY LINE WHICH IS FED FROM ONE SIDE

BACKGROUND OF THE INVENTION

Field of the Invention

The invention relates to a method for determining a faulty section of a power supply line which is fed from one side and which is divided into a plurality of sections by switching devices, wherein each switching device has an associated measurement device.

Electrical power supply networks at the medium or low voltage level are used to transmission electrical power to individual end users. Since deregulation of the power supply, decentralized feed-ins into the power supply network are increasingly also being made in many countries. Such decentralized feed-ins are by way of example what are known as regenerative power producers, i.e. power producers which provide electrical power from power sources which can be renewed quickly, such as wind or solar radiation. Energy producers of this kind can be wind turbines or photovoltaic systems by way of example.

Power supply networks at the medium and low voltage level often include power supply lines which are fed from one side and which are divided into a plurality of sections for more effective monitoring. A network with this form, in contrast to interconnected networks, is also called a radial system. Each section is delimited at its ends by means of switching devices which, depending on their switching capacity, can be constructed in the form of power breakers or circuit breakers. Individual end users in the form of electric loads of power producers in the form of feed-ins can be connected to the individual sections. This construction is conventional in particular in markets shaped by the USA, although power supply networks with power supply lines of this kind which are fed from one side are also used in west European markets, by way of example in cable networks in the lower medium voltage range (about 20 kV).

For radial systems in the medium and low voltage range, reliable fault identification and location should take place quickly in the event of a fault, in particular a short-circuit, which occurs on one of the sections of a power supply line, i.e. the section affected by the fault must be quickly and reliably identified and turned off.

Electromechanical short-circuit indicators, which are provided directly on the respective sections of the power supply line, are often used for fault identification and location. These indicators only react in the case of high short-circuit currents which are significantly above the nominal current of the power supply line. The devices are usually read manually, i.e. the section affected by the short circuit is often determined only after a relatively long time. A short-circuit indicator of this kind is known by way of example from German patent DE 10 2007 020 955 B4.

A method is also known from European patent EP 0 554 553 B1 in which the sections of a power supply line are delimited from each other by switching devices (what are known as "sectionalizers"). A respective protection unit is associated with the switching devices. The individual protection units are connected to each other and to a main protection unit by way of a communication line. A fault is identified by the main protection unit. This sends a query to the individual protection units which, with reference to a voltage signal, check whether there is a fault on the section associated with them and send back a corresponding response. Those protection units which, with reference to the responses, identify that they isolate a fault-free section from a faulty section, cause the switching contacts of the corresponding switching device to open.

BRIEF SUMMARY OF THE INVENTION

The invention is based on the object of disclosing an optimally sensitive and reliable method of the type mentioned in the introduction and a measuring device which carries out a method of this kind.

To achieve this object a method is proposed according to the invention in which each measurement device detects a current signal at a measurement point which is arranged in the region of the respective switching device, said current signal indicating a current flowing at the respective measurement point, samples the current signal so as to form current sample values, and determines a current measurement variable from the current sample values; each measurement device forms a delta current value as the difference between an instantaneous current measurement variable and a previous current measurement variable which was determined a fixed number of periods of the current signal ago, the measurement device compares the delta current value with a current threshold value and identifies a jump in current when the delta current value is above the current threshold value; each measurement device sends a first status message, which indicates a jump in current, when it has identified a jump in current. A fault location device identifies a fault as being present on that section of the power supply line which is delimited at one end by a switching device of which the measurement device has identified a jump in current, and is delimited at its other end by a switching device of which the measurement device has not identified a jump in current.

One advantage of the inventive method is that very sensitive fault identification can take place owing to the formation of the delta current values since influences from electrical loads or from inflowing or outflowing currents are ignored and only the part relevant to the fault is considered. The method can therefore attain a sensitivity which is below the nominal current of the power supply line, so even high-impedance faults may be detected.

The previous current values used to form the delta current value may have been determined by way of example two or three periods of the current signal before the instantaneous current measurement variable. The fixed number does not have to be an integer, although the choice of an integral number is often expedient in order to avoid oscillating effects. The current signal is sampled by way of example at clock rates between 600 Hz and 1 kHz.

The first status message can include binary information by way of example, so a large communications link bandwidth is not necessary for its transmission.

The inventive method is carried out separately for each phase in the case of a multi-phase power supply line.

An advantageous embodiment of the inventive method provides that the current measurement variable is determined as an effective value or as a basic oscillation component from the current sample values.

This embodiment has the advantage that to carry out the inventive method only the current signals have to be measured, so the use of expensive voltage transformers may be dispensed with in this connection. The delta current values are then calculated and the fault identification and location made solely using the measured currents.

If, however, voltage transformers are present anyway, or should they also be being used for other purposes, it may also be provided that the current measurement variable is calculated from the current sample values and associated voltage sample values. In this case the current measurement variable may for example be an electrical power (for example an active power or a reactive power).

According to a further embodiment of the inventive method it may be provided that the current threshold value is statically fixed.

Static fixing has the advantage that it manages with relatively few device settings and comparatively simple device parameterization can therefore occur. The static current threshold value must in this case be fixed in such a way that current fluctuations due to changes in load or charging processes in the respective section are not classified as a jump in current. Suitable values for setting the static current threshold value are for example between about 5% and 15% of the nominal current valid for the respective section.

As an alternative to the static fixing of the current threshold value, according to a further embodiment of the inventive method it may also be provided that the current threshold value is dynamically fixed.

The respectively used current threshold value can thus be adjusted to the instantaneous operating situation of the respective section.

Specifically, it may be provided in this context that the current threshold value is dynamically formed as a function of a differential current value which is formed using a difference between the current measurement variables determined at the two ends of a section of the power supply line.

As a result a measurement of the load currents and feed-ins during normal operation occurs more or less at the two ends of a section, so, during operation, the responsiveness (for example to moderately changing load or feed-in-in conditions) can be adaptively adjusted. In order not to unintentionally make an adaptive adjustment to a fault situation on the respective section, current measurement variables for forming the differential current value should be used in which a jump in current has not been identified.

According to a further advantageous embodiment of the inventive method it may also be provided that, instead of the previous current measurement variable, a fixed maximum value is used for forming the delta current value if the previous current measurement variable exceeds a predefined comparison threshold value.

An undesirable jump in current identification by the measurement devices in the event of transformer saturation during a fault can be avoided as a result.

The comparison threshold value can be formed by way of example as a function of a differential current value which is formed by using a difference between the current measurement variables determined at the two ends of a section of the power supply line.

Specifically, the comparison threshold value can be formed by way of example using the differential current and the nominal current in accordance with the following equation:

$$I_v - I_{N,i} = I_{Diff,i},$$

where $I_v$ indicates the comparison threshold value, $I_{N,i}$ the nominal current valid at the measurement point I and $I_{Diff,i}$ the differential current value formed at the measurement point i.

A further advantageous embodiment of the inventive method provides that the error location device is a component of at least one of the measurement devices.

In this case the identification and location of a fault is carried out by one or more measurement devices themselves.

Alternatively, it may also be provided that the fault location device is a component of a central evaluation device different from the measurement devices.

This evaluation device can be by way of example a separate device integrated in a protection unit provided at the feed-in of the power supply line or be a component of a network control installation, for example a SCADA system (SCADA=Supervisory Control and Data Acquisition).

A further advantageous embodiment of the inventive method provides that the measurement devices, if they do not identify a jump in current, send a second status message at regular intervals, and this indicates that no jump in current was identified and that the measurement devices repeat the first status message at intervals which are shorter than the intervals in which the second status message is sent.

In this case the second status message is a cyclical message which at regular intervals announces a normal operating state of the respective section. The intervals used for this can be in seconds by way of example (for example between about 1-10 seconds). The first status message, by contrast, is a spontaneous message which is transmitted as soon as a jump in current is identified and is repeated in very short intervals (for example at intervals of a few milliseconds). On the one hand, the functionality of the communications link between the individual measurement devices and the fault location device can be checked in this way with reference to the correctly received second status messages and, on the other hand, it can be ensured that the first status message is generated as soon as a jump in current is identified which could point to a fault. The frequent repetition of the first status message can ensure that the information about the jump in current arrives safely at the receiver and is not lost as a result of individual telegram losses on the communications link.

It may be provided by way of example that the status messages are sent as broadcast messages or multicast messages. This means that the information contained in the status messages is transmitted not just to one receiver but virtually simultaneously to all (broadcast) or a plurality of receivers (multicast).

The status messages can be transmitted by way of any desired methods. In the simplest case binary signals can be applied to a copper wire ("pilot wire") for this purpose. A wide variety of transmission protocols, such as DNP 3 (Distributed Network Protocol) or control technology protocols, such as Modbus, may also be considered.

According to a particularly advantageous embodiment it may by way of example be provided that the status messages are formed as GOOSE messages to the IEC 61850 standard.

These GOOSE messages (Generic Object Oriented Substation Event) are described in the IEC 61850 standard, which regulates communication in electrical switchgear in particular, and are particularly suited to very fast transmission of short (in particular binary) contents.

According to a further embodiment of the inventive method exact synchronization is not necessary for transmission of the first status messages, for example by way of GOOSE messages to IEC 68150. It is sufficient to take into account the maximum run time across the communications network. In this connection it may be provided that the fault location device identifies a fault as being present on a certain section of the power supply line if within a maximum period after identification of a jump in current by the measurement device at one end of the section a first status message of the measurement device does not materialize at the second end of the section.

The maximum period can take into account by way of example the transmission time between the respective measurement device and the fault location device and a time reserve for the non-synchronous sampling of the current signal at the respective measurement point.

To increase security against wrong decisions still further, according to a further advantageous embodiment of the inventive method it may be provided that the fault location device only identifies a fault as being present on the certain section if the delta current value of that measurement device, which identified the jump in current, lies above a confirmation threshold value, which is formed as a function of a differential current value, which is formed by using a difference between the current measurement variables determined at the two ends of a section of the power supply line.

A further condition for identification of a fault which actually exists can be provided hereby in particular in the case of current threshold values which are chosen so as to be relatively low with respect to identification of a jump in current.

If the switching devices at the individual sections for switching off fault currents are suitable power breakers, then according to a further advantageous embodiment of the inventive method it may be provided that in the case of a fault identified on a certain section of the power supply line, those switching devices which delimit this section of the power supply line are opened immediately.

Alternatively, it may also be provided that in the case of a fault identified on a certain section of the power supply line, firstly a power breaker upstream of the switching devices on the feed side is opened and only after opening of the power breaker are those switching devices which delimit this section of the power supply line opened.

With this alternative, compared to a power breaker, the switching devices on the sections can be less expensive circuit breakers, with a relatively low switching power since the fault current is switched off by the power breaker provided at the feed side, which forms, as it were, a main switch for the power supply line.

In this connection it may also be provided that the power breaker is closed again after the switching devices delimiting the faulty section have been opened.

The power supply for the end users up to the faulty section can be promptly restored in this way.

To enable restoration of the power supply as quickly as possible for the loads present downstream of the faulty section as well, it may also be provided in this connection that after the switching devices delimiting the faulty section have been opened, a connection switch is also closed which connects that part of the power supply line, which adjoins the end of the faulty section remote from the feed-in, to a further feed-in.

Those loads and feed-ins which are arranged on sections which are not affected by the fault can be promptly supplied with electrical power again as a result.

The object mentioned above is also achieved by a measurement device for determining a faulty section which is fed from one side, wherein the power supply line is divided by switching devices into a plurality of sections and wherein the measurement device can be associated with one of the switching devices.

According to the invention it is provided that the measurement device is set up to carry out a method as claimed.

A plurality of such measurement devices, together with a fault location device, forms a system for determining a faulty section of a power supply line which is fed from one side. The fault location device can be a component of one of the measurement devices, be constructed as a separate device or be integrated in a higher-order protection unit or control device.

BRIEF DESCRIPTION OF THE SEVERAL VIEWS OF THE DRAWING

The invention shall be explained in more detail below with reference to exemplary embodiments. In the drawings.

DESCRIPTION OF THE INVENTION

Figure 1:
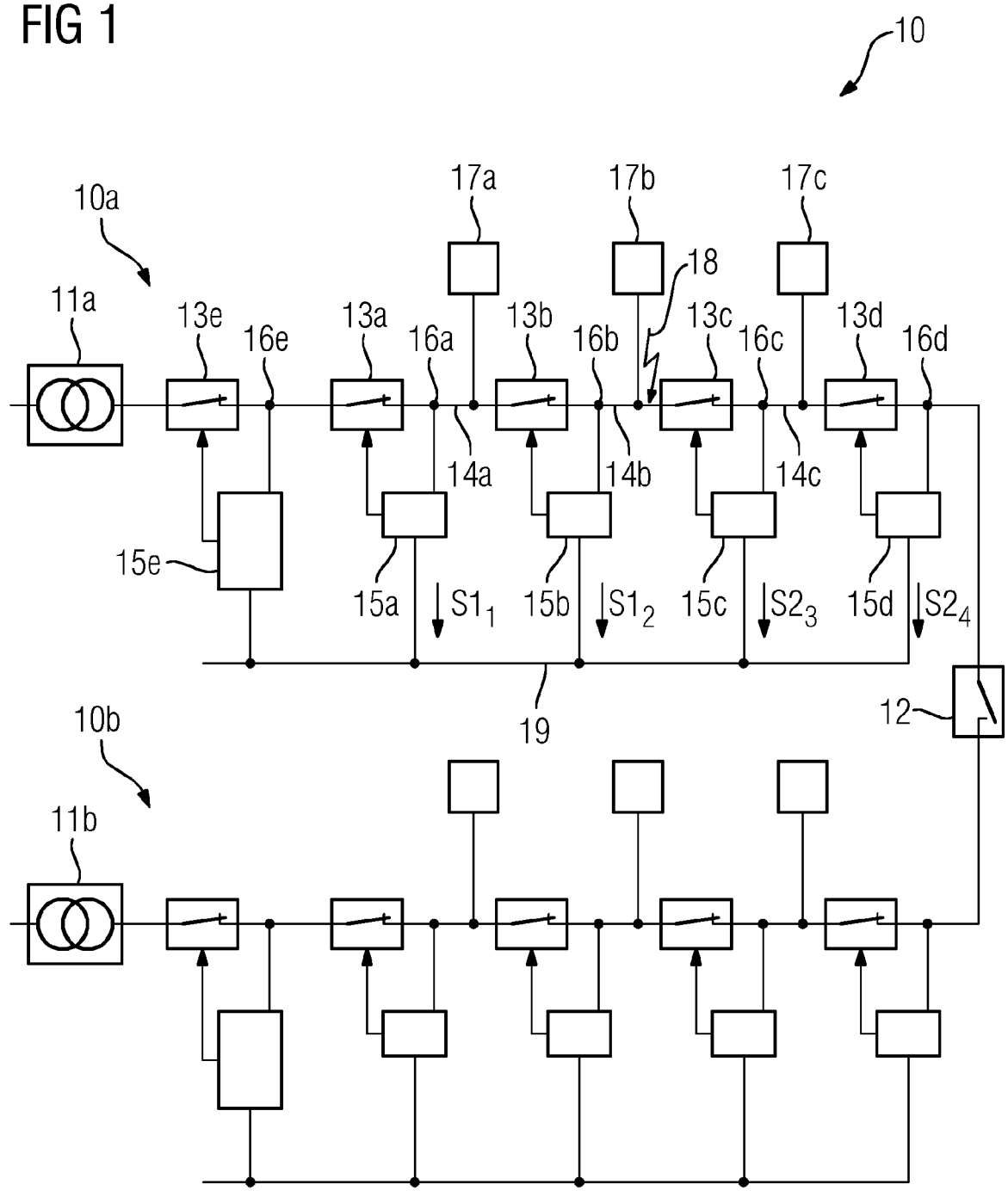
FIG. 1 shows a schematic view of a first embodiment of an electrical power supply network with two power supply lines which are fed from one side.

FIG. 1 shows in a schematic diagram part of an electrical power supply network 10 which may, by way of example, be a medium-voltage distribution network. The power supply network 10 includes a first power supply line 10a and a second power supply line 10b. The power supply lines 10a, 10b are fed with electrical power from one side by transformers 11a, 11b. The transformers can be fed on the primary side by one or more source(s). At their end remote from the feed-in the power supply lines 10a, 10b can in some cases be coupled to each other by means of a conventionally open connection switch 12. This will be discussed in more detail later.

In the exemplary embodiment according to FIG. 1, the construction of the two power supply lines 10a and 10b is the same for the sake of simplicity, so, apart from at explicitly mentioned points, the following statements with respect to power supply line 10a are representative for both power supply lines 10a and 10b.

The power supply line 10a is divided by means of switching devices 13a-d into a plurality of sections 14a-c. Each section 14a-c is delimited here by two of the switching devices 13a-d. The switching devices 13a-d can be circuit breakers or power breakers depending on switching capacity. At the feed side one power breaker 13e is provided which can isolate the entire power supply line 10a from the feed-in by the transformer 11a and therefore acts more or less as a main switch for the power supply line 10a.

Measurement devices 15a-d are associated with the individual switching devices 13a-d. These record current signals at measurement points 16a-d arranged in the vicinity of the respective switching devices 13a-d. The signals indicate the current flowing in the power supply line at the respective measurement point 16a-d. A protection unit 15e is associated with the power breaker 13e.

Electrical consumers in the form of loads, or electrical power producers in the form of sources can be connected to each section 14a-c of the power supply line 10a. Loads 17a and 17b and a source 17c are shown by way of example in FIG. 1, and these are connected to sections 14a-c.

The individual measurement devices 15a-d are connected to each other by a communications link 19, so information can be exchanged between the measurement devices 15a-d. The protection unit 15e is also connected to the communications link 19. The communications link can be constructed as desired. In the simplest case it can be a copper wire ("pilot wire") via which electrical signals can be transmitted. In addition, more complex communications links, in particular a communication bus, based by way of example on Ethernet, can also be used, however.

The power supply network 10 is illustrated in FIG. 1 in what is known as the "single line view" in which only one phase of the power supply network is shown. In actual fact the power supply network 10 is conventionally a multi-phase (for example three phase) network. The method described below is therefore carried out for each of the phases present.

If a fault, by way of example a short circuit, occurs on a section, the fault should firstly be identified as quickly as possible and the fault current switched off. Secondly, the section of the power supply line affected by the fault must be identified and isolated so the healthy sections can be supplied with electrical power again as quickly as possible.

A method for determining a faulty section shall be explained below using the example of a short-circuit 18 present on section 14*b*.

Each measurement device detects a current signal for each phase by way of transformers arranged at the measurement points 16*a-d*. The detected current signal is sampled by a sampler so as to form phase-related current sample values. Sampling of this kind can occur by way of example at a sampling rate of 600 Hz-1 kHz. A current measurement variable is determined from the sample vales using a computer (for example a digital signal processor (DSP) or a central processing unit (CPU) of the measurement device. The current measurement variable can be by way of example an effective value or a fundamental oscillation value (for example for the 50 Hz component of the current signal). The fundamental oscillation value [is] obtained by digital filtering from the current sample values, wherein a filter adjusted accordingly to the fundamental oscillation determines a sinusoidal component of the sample values and a further filter adjusted to the fundamental oscillation determines a cosinusoidal component of the sample values. The root of the sum of the squared components (sine and cosine) is determined to form the fundamental oscillation value. If harmonics, which are produced for example by switching on transformers between the measurement points 16*a-d*, are to be suppressed in the case of the current measurement variable, the fundamental oscillation value is used. If harmonics are to be included in the evaluation in the case of the current measurement variable, then this may be achieved by forming the effective value. In general a protective function can be briefly temporarily suppressed in the measurement devices 15*a-d* and/or the protection unit 15*e* when high harmonics components occur. The advantage when using the effective value or the fundamental oscillation value lies in the fact that, apart from detecting the current signal, no further measurements have to be carried out, so only current transformers are required. If, however, voltage transformers are already present or voltage transformers are also required for other purposes, the current measurement variable can also be formed from a mathematical linking of current sample values and associated voltage sample values (for example in the form of an active power or a reactive power). The manner in which the current measurement variable should be formed can be chosen by the power supply network operator by way of appropriate parameterization of the measurement devices. In any measurement device determination of the current measurement variable provides the value $I_j(t)$, where j denotes the respective measurement device (for example the current measurement variable $I_2(t)$ is formed from the second measurement device 15*b* of the power supply line 10*a*). For the sake of simplicity only one phase will be considered here. In real life, as mentioned, the current signal is measured and the current measurement variable calculated for all phases of the power supply line 10*a* and is carried out continually for all measurement points.

The instantaneously calculated value of the current measurement variable is subtracted from a previous current measurement variable, so a delta current variable $DI_j(t)$ results as the difference. The previous current measurement variable has already been formed some (e.g. 2-3) periods (N) of the current signal previous and stored in the respective measurement device, for example in a ring memory. The previous current measurement variables do not necessarily have to have been determined an integral number of periods of the current signal previous, but the use of an integer is expedient to avoid oscillation effects. The delta current value is determined by way of example in using a previous current measurement variable formed two periods (N) ago in accordance with the following equation:

$$DI_j(t)=I_j(t)-I_j(t-2N)$$

During stable operation the delta current variable $DI_j(t)$ has a value of close to zero since there is then no change in current on the respective section 14*a-c* of the power supply line 10*a*.

The respective delta current value is compared with a current threshold value $S_I$ in each measurement device 15*a-d* and a jump in current is identified on the respective section when the delta current value is above the current threshold value. A jump in current is in this connection taken to mean a positive change in current of a certain minimum size. Immediately after identification of the jump in current the measurement devices 15*a-d* send first status messages $S1_j$, which indicate an identified jump in current at measurement point j, via communications link 19. These first status messages $S1_j$ can be simple binary signals (low, high) by way of example. In a preferred embodiment binary signals of this kind are transmitted as multicast messages in the form of what are known as GOOSE messages to standard IEC 61850.

In the example in FIG. 1 a fault current $I_F$, which is fed by the transformer 11*a*, flows through at the short-circuit point 18. The protection unit 15*e* identifies a jump in current. The measurement devices 15*a* and 15*b* likewise identify a jump in current and send first status messages $S1_1$ and $S1_2$. The remaining measurement devices 15*c* and 15*d* do not identify a jump in current, however (for example since the flowing current remains the same or even drops), and do not send first status messages. Instead it may be provided that all measurement devices, which do not identify a jump in current, emit a second status message $S2_j$ at regular intervals, i.e. cyclically, wherein the intervals in which a second status message of this kind is sent can be a few seconds by way of example. The first status message $S1_j$ is also emitted repeatedly in particular if the status messages are GOOSE messages, wherein the interval in which the first status messages are repeated is much shorter (for example a few milliseconds) than the interval used for the second status messages.

A static value by way of example may be used as the current threshold value $S_1$ for evaluating the delta current value, and this can be adjusted for example at about 5%-15% of the nominal current $I_N$ valid for the respective section 14*a-c* (i.e. with a current threshold value of 5% of the nominal current changes in the delta current value of less than 5% of the nominal current do not generate identification of a jump in current). Constant values of the delta current, slight changes in current, a load drop or switching-off of an external short-circuit current do not trigger identification of a jump in current in this connection.

The current threshold value may also be dynamically determined, however, and adjusted to the level of a differential current value (for example 25% of the differential current value) which is determined using the difference in the current sample values between adjacent measurement devices. Specifically, the differential current value can be formed by way of example in accordance with the following equation:

$$I_{Diff,j}=I_{corr}+k^*|(I_j-I_{j+1})|.$$

$I_{corr}$ is a correction value for the respective section and is intended to balance out errors in the determination of the current sample values (for example due to charging currents, transformer faults, etc.). The safety factor k affects the sensitivity, i.e. in the case of higher k values the differential current value used as the current threshold value for the delta current value is increased and the method for identifying a jump in current is therefore less sensitive (the safety factor can assume values of k=1, . . . 1, 2 by way of example). To determine the differential current value the respective current measurement variables $I_j$ between the measurement devices 15a-d must be replaced every phase. This occurs for example at an interval of one second, and only for as long as the delta current values are almost zero, via GOOSE message by way of the communications network. The choice of a dynamic threshold value has the advantage that out- or in-flowing currents on section 14a-c due to loads or sources are taken into account in the differential current value. The method has maximum sensitivity if there are no loads or sources present.

The first status messages $S1_j$ are transmitted to a fault location device which, by way of example, can be a component of a measurement device (or of all measurement devices) or can be integrated in the protection unit 15e. The fault location device can be linked in the protection unit with for example the trigger condition there (for example overcurrent protection or distance protection). The fault location device identifies the short-circuit as being present on the section which is delimited by those measurement devices of which one has identified a jump in current and the other has not identified a jump in current. In the case of FIG. 1 measurement device 15b identifies a jump in current whereas measurement device 15c does not identify a jump in current. This can be identified by the fault location device with reference to the presence or absence of the respective first status message. In this case the fault location device consequently identifies the short circuit on section 14b.

If the switching devices 13a-d is power breakers which are capable of switching off short-circuit currents then switching devices 13b and 13c, which delimit the faulty section 14b of the power supply line 10a, can subsequently be opened immediately. This may be brought about either by the measurement devices 15b and 15c themselves or be triggered by the protection unit 15e by means of corresponding trigger commands.

If the switching devices 13a-d are merely circuit breakers with a low switching capacity, then, following location of the fault on section 14b, firstly the power breaker 13e connected upstream of the switching devices 13a-d on the feed side is opened. As a consequence identification of the jump in current in the measurement devices 15a and 15b, and therewith the formation of the first status message, drops back if the current at all measurement points 16a-d on the power supply line 10a switched off by the power breaker 13e drops below the current threshold value. Only after the power breaker 13a has been opened are switching devices 13b and 13c, which delimit the section 14b, opened since the switching devices 13b and 13c are caused to open. This can occur by way of the measurement devices 15b and 15c themselves. Alternatively, the switching devices 13b and 13c are opened by the power breaker controller or the protection unit 15e. The power breaker 13e can be closed again with the feedback from the switching devices that the open state is prevailing. After the switching devices 13b and 13c, which delimit the faulty section 14b, have been opened the connection switch 12, which connects that part of the power supply line 10a which adjoins the end of the faulty section 14b remote from the feed-in, i.e. section 14c, to the second power supply line 10b, can be closed, so a power supply can be restored for this healthy section 14c.

To be able to form the delta current value even more reliably and to avoid effects due to transformer saturations that occur possibly during a short-circuit, it may also be provided that a fixed maximum value is used to form the delta current value instead of the previous current measurement variable when the previous current measurement variable exceeds a predefined comparison threshold value. The comparison threshold value $I_{comp}$ can be adjusted by way of example to the differential current value as well and also take into account the nominal current applicable to the respective measurement point as well:

$$I_{comp,j} = I_{N,j} + I_{Diff,j}.$$

The maximum value can also assume the size of the comparison threshold value. For larger currents (in particular short-circuit currents) the delta current value is therefore formed from the difference in the instantaneously calculated current measurement variable and the constant value of the comparison threshold value $I_{comp}$. This prevents the delta current value which is to be evaluated from becoming zero after a certain number of periods and, owing to a subsequent saturation of a current transformer, a hyper function occurring due to a delta current produced thereby. During a short circuit the current flowing through is therefore limited to the portion relevant to the short-circuit.

Fault location by way of the fault location device can be assisted by way of example in that time stamps are associated with the first status messages $S1_j$ of the respective measurement devices 15a-d and the current signals in the measurement devices 15a-d are sampled synchronously. The method described above can also be carried out particularly easily with measurement devices 15a-d that do not operate synchronously in that the fault location device identifies a fault as being present on a certain section of the power supply line if within a maximum period after identification of a jump in current by the measurement device 15b at one end of section 14b a first status message $S1_3$ of the measurement device 15c does not materialize at the second end of section 14b. It is assumed in this connection that the measurement devices 15a-d send a first status message $S1_j$ immediately after a jump in current has been identified. The maximum duration therefore includes the maximum transmission time from the respective measurement devices 15a-d to the fault location device plus a reserve duration for the non-synchronous execution of an identification of a jump in current in the individual measurement devices. The maximum transmission duration is twice the mean transmission time between the respective measurement device 15a-d and the fault location device or the transmission time that a message requires for forward and backward transmission. This can be measured by straightforward time stamping of test messages.

In order to be able to distinguish jumps in current due to relatively large changes in load (for example switching on a high-power electrical load) from jumps in current due to short-circuits even more reliably using the method, it may also be provided that the fault location device only identifies a fault as being present on the specific section if the delta current value of that measurement device which identified the jump in current lies above a confirmation threshold value which is formed as a function of the differential current value. The differential current value adaptively adjusts itself to slower changes in load, so a jump in current can be better categorized as pertaining to a load or to a fault by way of this additional plausibility check. The level of the delta current value can either be checked by the fault location device or be made by the respective measurement device itself. In the latter case sending of the first status message when this plausibility condition is not met is suppressed by the respective measurement device.

Figure 2:
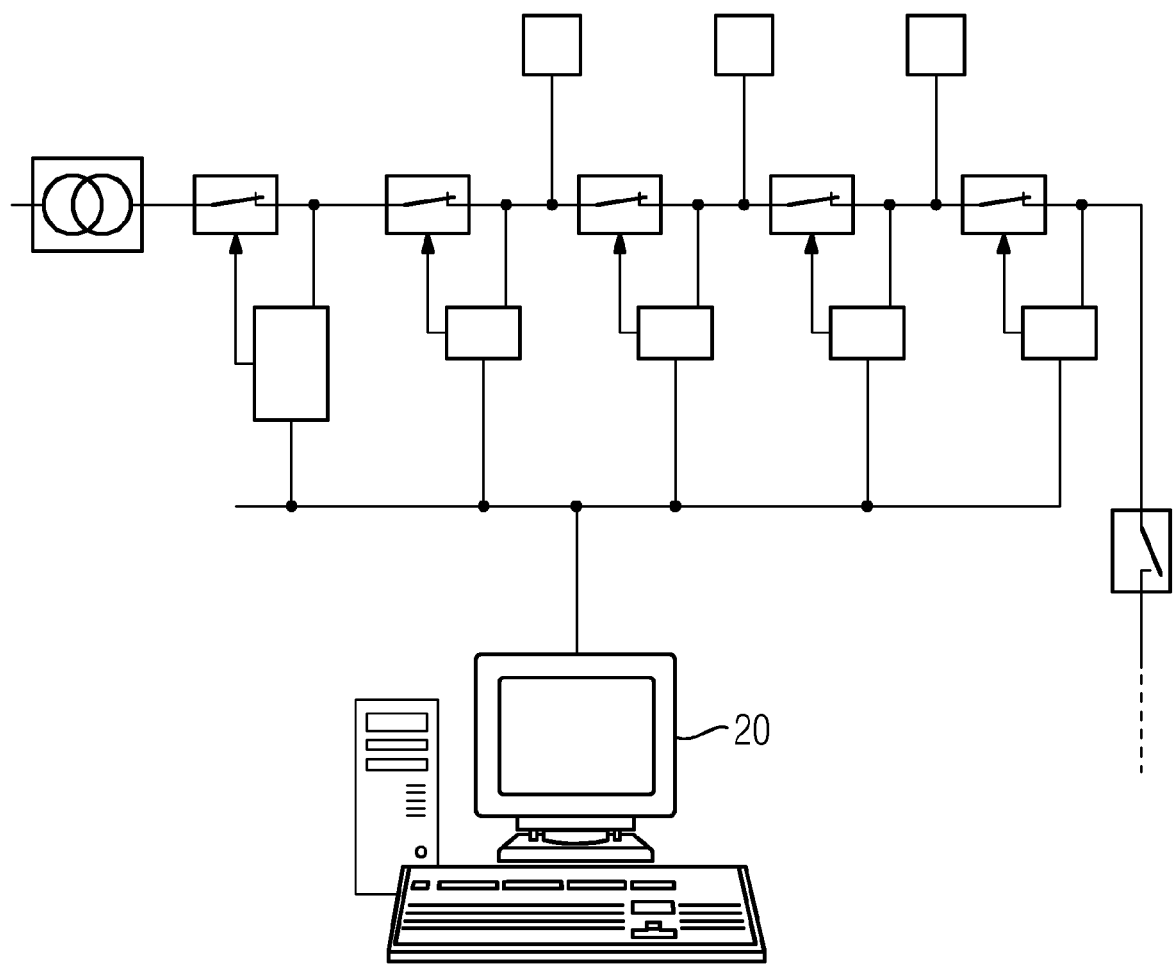
FIG. 2 shows a schematic view of a second embodiment of an electrical power supply network with a central fault location device.

FIG. 2 finally shows an exemplary embodiment of a power supply network in which only the position of the fault location device differs from the situation in FIG. 1. Instead of in one of the measurement devices or the protection unit, the fault location device according to FIG. 2 is integrated in a data processing device 20 of a network control center (for example a SCADA system) which monitors operation of the power supply network. Otherwise the procedure already described in relation to FIG. 1 is used in the case of fault identification and location, so this does not need to be discussed again separately.

To summarize, a method has been described above which enables fault identification and location in power supply lines which are fed from side. Fault identification and location is robust with respect to feed-ins or loads on the sections of the power supply line and is achieved by a sensitive current measurement method which is carried out in the measurement devices which monitor the respective section of the line. In principle only the currents measured by a current transformer are required, so no expensive voltage transformers have to be provided (the voltage signal can also be used, however, with existing voltage transformers). The method is characterized in that only a few variables, mostly binary, are transmitted which can be formed for example in the form of a GOOSE message to IEC 61850. Evaluation of these signals occurs in the measurement devices themselves or in a higher-order device which can be provided for example at the feed-in. The faulty line section can be isolated from the network by opening the switching devices which delimit it. With further switching operations those line sections of the network which are not affected by the short circuit can be supplied with power again. The power supply of sections of the line which are not affected can therefore be restored in seconds.

The invention claimed is:

1. A method of determining a faulty section of a power supply line that is fed from one side and is divided into a plurality of sections by switching devices, wherein each switching device has a measurement device associated therewith, the method comprising:
    detecting with each measurement device a current signal at a measurement point at the respective switching device, the current signal indicating a current flowing at the respective measurement point;
    sampling with each measurement device the current signal to form current sample values and determining a current measurement variable from the current sample values;
    forming with each measurement device a delta current value being a difference between an instantaneous current measurement variable and a previous current measurement variable determined a fixed number of periods of the current signal before;
    comparing with each measurement device the delta current value with a current threshold value and identifying a jump in current when the delta current value lies above the current threshold value;
    sending a status message with each measurement device, the status message indicating a jump in current, upon identifying the jump in current; and
    identifying with a fault location device a fault as being present on that section of the power supply line which is delimited at one end by a switching device at which the respective measurement device has identified the jump in current, and is delimited at another end by a switching device of which the respective measurement device has not identified a jump in current.

2. The method according to claim 1, which comprises determining the current measurement variable as an effective value or as a basic oscillation component from the current sample values or from the current sample values and associated voltage sample values.

3. The method according to claim 1, wherein the current threshold value is statically fixed.

4. The method according to claim 1, wherein the current threshold value is dynamically fixed.

5. The method according to claim 4, wherein the current threshold value is dynamically formed as a function of a differential current value that is formed from a difference between the current measurement variables determined at the one end and the other end of a section of the power supply line.

6. The method according to claim 1, wherein the step of forming the delta current value comprises substituting a fixed maximum value for the previous current measurement variable when the previous current measurement variable exceeds a predefined comparison threshold value.

7. The method according to claim 6, which comprises forming the comparison threshold value as a function of a differential current value that is formed using a difference between the current measurement variables determined at the one end and the other end of a section of the power supply line.

8. The method according to claim 1, wherein the fault location device is a component of at least one of the measurement devices.

9. The method according to claim 1, wherein the fault location device is a component of a central evaluation device that is different from the measurement devices.

10. The method according to claim 1, wherein the status message indicating a jump in current is a first status message, and the measurement devices, if no jump in current is identified, send a second status message at regular intervals, the second status message indicating that no jump in current has been identified, and the measurement devices repeating the first status message at intervals that are shorter than the regular intervals in which the second status message is sent.

11. The method according to claim 10, wherein the first and/or second status messages are GOOSE messages according to the IEC 61850 standard.

12. The method according to claim 10, which comprises identifying with the fault location device a fault as being present on a given section of the power supply line if within a maximum period after identification of a jump in current by the measurement device at one end of the section a first status message of the measurement device does not materialize at the second end of the section.

13. The method according to claim 12, which comprises identifying with the fault location device a fault as being present on the certain section only when the delta current value of the measurement device, which identified the jump in current, lies above a confirmation threshold value, which is formed as a function of a differential current value formed by using a difference between the current measurement variables determined at the two ends of a section of the power supply line.

14. The method according to claim 1, which comprises, in the event that a fault is identified on a given section of the power supply line, immediately opening those switching devices that delimit the given section of the power supply line.

15. The method according to claim 1, which comprises, in the event that a fault is identified on a given section of the power supply line, firstly opening a power breaker upstream of the switching devices on a feed side and, only after the power breaker has been opened, opening those switching devices that delimit the given section of the power supply line.

16. The method according to claim 15, which comprises, after the switching devices delimiting the given faulty section have been opened, closing the power breaker.

17. The method according to claim 16, which comprises, after the switching devices delimiting the given faulty section have been opened, closing a connection switch that connects a part of the power supply line adjoining the end of the faulty section distal from the feed-in, to a further feed-in.

18. In combination with a power supply line having a feed side and a plurality of sections connected by way of switching devices, a measurement device for determining a faulty section in the power supply line, wherein the measurement device may be associated with one of the switching devices, the measurement device comprising:

means for detecting a current signal at a measurement point at the respective switching device, the current signal indicating a current flowing at the respective measurement point;
   means for sampling the current signal to form current sample values and determining a current measurement variable from the current sample values;
   means for forming a delta current value being a difference between an instantaneous current measurement variable and a previous current measurement variable determined a fixed number of periods of the current signal before;
   a comparator for comparing the delta current value with a current threshold value and identifying a jump in current when the delta current value lies above the current threshold value;
   a transmission device for sending a status message indicating a jump in current, upon identifying the jump in current, to a fault location device to enable the fault location device to disconnect the respective section in which the jump in current has been identified from the power supply line.

19. The measurement device according to claim 18, wherein the fault location device is a component of the measurement device.

20. The measurement device according to claim 18, wherein the fault location device is a component of a central evaluation device distal from and different from the measurement device.

21. The measurement device according to claim 18, configured to issue, at regular intervals, the status message indicating a jump in current as a first status message and also a second status message indicating that no jump in current has been identified, and to repeat the first status message at intervals that are shorter than the regular intervals in which the second status message is sent.

22. The measurement device according to claim 21, wherein said transmission device is configured to transmit the first and/or second status messages in the form of GOOSE messages according to the IEC 61850 standard.

* * * * *